(12) United States Patent
Mazahreh

(10) Patent No.: US 7,555,684 B1
(45) Date of Patent: Jun. 30, 2009

(54) CIRCUIT FOR AND A METHOD OF GENERATING AN INTERLEAVER ADDRESS

(75) Inventor: Raied Naj Mazahreh, Salt Lake City, UT (US)

(73) Assignee: Xilinx, Inc., San Jose, CA (US)

( * ) Notice: Subject to any disclaimer, the term of this patent is extended or adjusted under 35 U.S.C. 154(b) by 562 days.

(21) Appl. No.: 11/333,971

(22) Filed: Jan. 17, 2006

(51) Int. Cl.
*G11C 29/00* (2006.01)
(52) U.S. Cl. .................................................. 714/702
(58) Field of Classification Search ............... 714/755, 714/701, 746
See application file for complete search history.

(56) References Cited

U.S. PATENT DOCUMENTS 6,775,800 B2 * 8/2004 Edmonston et al. ......... 714/755
6,910,110 B2 * 6/2005 Kim et al. ................... 711/157
7,058,874 B2 * 6/2006 Zhou ........................... 714/756

* cited by examiner

*Primary Examiner*—Shelly A Chase
(74) *Attorney, Agent, or Firm*—John J. King

(57) ABSTRACT

A method of generating interleaver addresses in a circuit for decoding data is disclosed. The method comprises the steps of receiving a data stream having a plurality of data blocks, each block having N bits; dividing each data block of the plurality of data blocks into m windows, each window comprising N/m bits; and calculating an interleaver address for each window as a function of modulo N/m. A circuit for generating an interleaver address in a circuit for decoding data is also disclosed.

17 Claims, 6 Drawing Sheets

CIRCUIT FOR AND A METHOD OF GENERATING AN INTERLEAVER ADDRESS

FIELD OF THE INVENTION

The present invention relates generally to circuits for data transmission, and in particular, to a circuit for and a method of generating an interleaver address.

BACKGROUND OF THE INVENTION

With the development of high-speed logic circuits, data communication equipment has continued to move toward digital implementations. The progress of communication systems is in part due to performance increases and cost reductions of digital circuit technology. Digital systems, which are generally more reliable than analog systems in noisy communications environments, must still be protected from random noise events on communication channels. Data scramblers, check codes, error correction codes, and interleavers are common techniques for protecting data from noise. The two most commonly used types of forward error correction codes are block codes and convolutional codes. Block codes involve operations that depend on the current input message and are independent of previous encodings. In contrast, convolutional codes involve output sequences that depend not only on the current input message, but also on a number of past message blocks. Interleavers are also commonly used for controlling impulse noise, which is characterized by high-power, short-duration bursts. An interleaver is a device that rearranges the order of a sequence of input symbols, or a collection of bits. The classic use of interleaving is to randomize the location of errors introduced in signal transmission. Interleaving spreads a burst of errors out so that error correction circuits have a better chance of correcting the data. If a particular interleaver is used at the transmit end of a channel, the inverse of that interleaver must be used at the receive end to recover the original data. The inverse interleaver is referred to as a de-interleaver.

Turbo Convolutional Coding (TCC) is used in a large number of wireless communication systems, such as third generation (3G) wireless and code division multiple access (CDMA) environments. Turbo Convolutional Coding is an advanced Forward Error Correction (FEC) algorithm which provides a powerful mechanism for protecting data transmissions. The encoder generates a data stream consisting of two independently encoded data streams and a single un-encoded data stream. Two parity streams, which are weakly correlated due to the interleaving, are also provided to the decoder. In the decoder, the two parity streams are separately decoded with soft decision outputs, referred to as 'extrinsic' information. The strength of the turbo decoding results from the sharing of the extrinsic information in a number of iterations. The extrinsic information is passed from one parity-decoding step to the other for each iteration. However, the implementation of a TCC decoder is difficult, particularly when high data rates are involved. Conventional interleaver circuits have limitations and inefficiencies in determining how a next interleaver address is processed. As data rates increase, the challenges of implementing TCC decoders will also increase.

In data processing systems, blocks of data are often divided into windows of data which are processed in parallel. Multiple soft input, soft output (SISO) decoders, also called MAP decoders, may be operated in parallel to increase the throughput of the decoding process. For example, a data block of N bits may be divided into m windows. According to one conventional method of generating an interleaver address in a system processing parallel windows of data, the least significant bits of an interleaver address $P_i(j)$ are used as the new interleaver address $P'_i(j)$ and the most significant bits are used as the window select signal $W_i(j)$. One of the plurality of parallel decoders operates to decode a particular data window. However, conventional circuits implementing parallel decoders where the most significant bits of the interleaver address represent a window select value require the number of windows to be powers of two. That is, the data block is divided into m windows, where m is a power of two, and the first m−1 windows have lengths that are also powers of two while the last window has the remaining data. In addition to requiring additional circuitry for the multiple address generators, this method has an adverse impact on Bit Error Rate (BER) performance, especially when the length of the last window is small. In particular, a separate address generator is required for each MAP decoder, where the output for each address generator (i) is based upon modulo (mod) N for a data block having N bits, and (ii) will result in a next address having the same least significant bits for each address generator, but different most significant bits determining the window select value. Another conventional method to generate a new interleaver address and window select signal is through a look up table that is implemented in memory, such as a block random access memory (BRAM). However, the BRAM requirements may make it impractical to build the TCC circuit in certain integrated circuits, such as a programmable logic device.

Accordingly, there is a need for an improved circuit for and a method of generating an interleaver address in a circuit for decoding data.

SUMMARY OF THE INVENTION

A method of generating interleaver addresses in a circuit for decoding data is disclosed. The method comprises the steps of receiving a data stream having a plurality of data blocks, each block having N bits; dividing each data block of the plurality of data blocks into m windows, each window comprising N/m bits; and calculating an interleaver address for each window as a function of modulo N/m. The method may further comprise steps of selecting value of N and/or m such that N/m comprises an integer. For example, after selecting a value of m, a value of N may be adjusted such that N/m equals an integer. Finally, the method may further comprise a step of generating a window select value as a function of modulo m, wherein the window select value may be based upon an overflow from generating an interleaver address.

According to an alternate embodiment, a method of generating interleaver addresses comprises the steps of receiving a data stream having a plurality of data blocks of N bits; dividing each data block of the plurality of data blocks into m windows, each window comprising N/m bits; generating a next interleaver address which may be based upon modulo N/m; and generating a window select value as a function of modulo m. The method may further comprise a step of receiving an incremental address for generating the next interleaver address, or receiving a previous interleaver address for generating the next interleaver address. The method may further comprise a step of generating a next interleaver address for each window of N/m bits. The method may further comprise a step of receiving an incremental window select value and a previous window select value for generating the next window select value, or a step of receiving an output from a circuit for generating a next interleaver address to generate the next window select value.

A circuit for generating interleaver addresses is also disclosed. The circuit comprising means for receiving a data stream having a plurality of blocks, each block having N bits; means for partitioning each block of the plurality of blocks into m windows, each window comprising N/m bits; and means for generating an interleaver address as a function of modulo N/m. The circuit may further comprising a means for calculating a window select value, wherein the means for calculating a window select value may comprise means for receiving an overflow from the means for generating an interleaver address. The circuit may further comprise means for decoding the data stream.

DETAILED DESCRIPTION OF THE DRAWINGS

Figure 1:
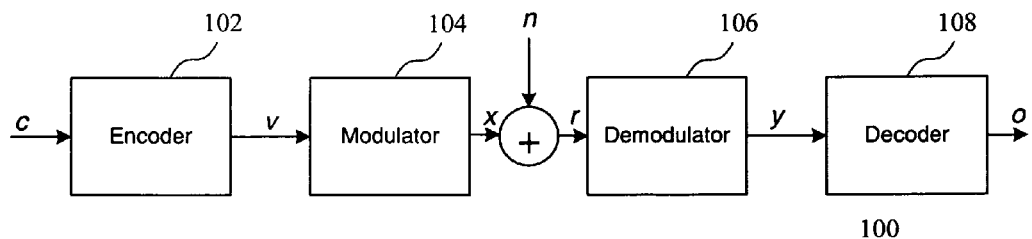
FIG. 1 is a block diagram of a communication system employing a decoder according to an embodiment of the present invention.

Turning first to FIG. 1, a block diagram of a communication system employing a decoder according to an embodiment of the present invention is shown. In particular, an encoder 102 receives an input signal "c" and generates an output signal "v" which is coupled to a modulator 104. The modulator outputs a modulated signal "x," which is affected by a noise signal "n," resulting in a signal "r." A demodulator 106 receives the signal "r" and provides a demodulated sequence "y" as output. A decoder 108 receives the demodulated sequence "y." The encoder 102 operates as a finite state machine (FSM). As a bit enters the encoder 102, it traverses through a sequence of non-arbitrary state transitions that are constrained by the encoding algorithm. Because of these constraints, the legitimate transmitted sequences are restricted to certain bit patterns, which are processed to produce an estimate of the original unencoded information sequence.

If there are transmission errors, the decoder 108 may conclude that such an encoded sequence could not have been generated by the encoder 102 and that errors have occurred. In this case, the decoder 108 may attempt to choose the legitimately encoded sequence that most resembles the demodulated sequence. The circuit of FIG. 1 may be implemented according to any encoding or modulation schemes. For example, the circuit may employ Quadrature Phase Shift Keying (QPSK) or Quadrature Amplitude Modulation (QAM). Similarly, the MAP algorithm, as is well known in the art, may be employed in a decoder to provide the estimated bit sequence (hard estimate) and also the probabilities (soft output) for each bit that has been decoded. While various embodiments of the invention are described in connection with a MAP decoder employed in a turbo convolutional coding (TCC) decoder, other decoding algorithms may be used.

Figure 2:
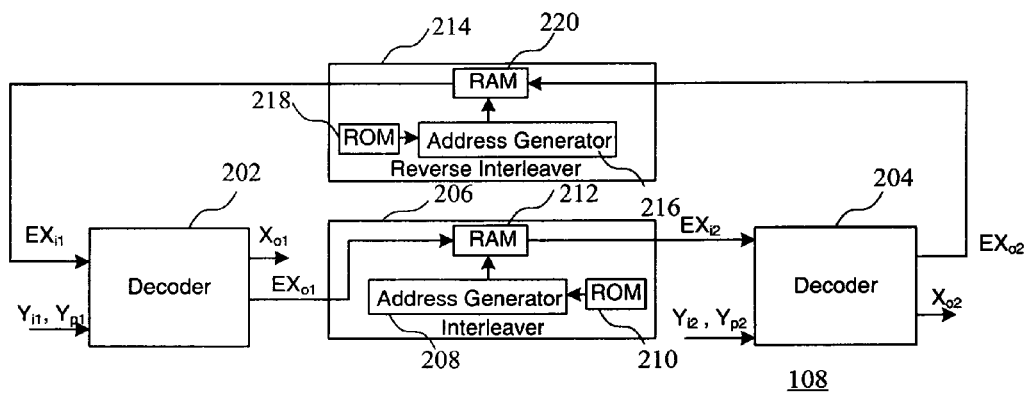
FIG. 2 is a block diagram of a turbo convolutional coding decoder according to an embodiment of the present invention.

Turning now to FIG. 2, a block diagram of a turbo convolutional coding decoder according to an embodiment of the present invention is shown. The decoder may be implemented using a pipelined recursion process. In this example, the decoder 108 includes two constituent MAP soft-input-soft-output (SISO) decoders 202 and 204. While the decoders 202 and 204 are shown as separate decoders for purposes of describing the operation of the circuit, it should be understood that a single decoder could be employed to provide the function of decoders 202 and 204. Data input bits $Y_{i1}$ and a first set of parity bits $Y_{p1}$ are coupled to the first SISO decoder 202. When implementing the MAP algorithm, for example, the first SISO decoder 202 computes the log likelihood ratio of the output based upon the input data. The extrinsic input $EX_{i1}$, associated with metrics information, initially is a null input. The data output $X_{O1}$ of the first SISO decoder 202 is discarded. The extrinsic output $EX_{o1}$ is applied to the input of an interleaver 206. The interleaver 206 rearranges the bits of the extrinsic signal $EX_{o1}$. That is, the extrinsic output $EX_{o1}$ is stored sequentially in memory locations of the memory 212, and read out using an interleaver address. An address generator 208 is coupled to a memory 210, which may be a read only memory (ROM) for storing initial and incremental interleaver address values and window select values. Alternatively, the initial and incremental interleaver address values and window select values may be coupled to the address generator from some other memory or provided by a separate input. Another memory 212, such as a random access memory (RAM), may be employed to store the extrinsic output $EX_{o1}$. As will be described in more detail in reference to FIG. 4, the address generator will generate the address enabling interleaving. That is, the address generator 208 receives an initial interleaver address and window select value, and generates a window select value $W_i(j)$ and a next interleaver address $P'_i(j)$ for the window.

The interleaved extrinsic signal output from interleaver 206 is coupled to the extrinsic input $EX_{i2}$ of the second SISO decoder 204. Data input bits $Y_{i2}$ and a second set of parity bits $Y_{p2}$ are applied to the data input of the second SISO decoder 204. The second SISO decoder 204 performs a decoding operation based on the parity bits $Y_{p2}$ and interleaved systematic bits $Y_{i2}$, and the bits from the interleaved extrinsic input $EX_{i2}$. The data output $X_{o2}$ of the second SISO decoder 204 comprises the decoded data.

Because the decoder 108 may not provide adequately decoded data in one pass, it is typically utilized in an iterative architecture. Accordingly, the extrinsic output of the second SISO decoder 204 is applied to the input of an reverse interleaver 214, which restores the bits to their previous order. That is, the reverse interleaver 214 also comprises an address generator 216. The address generator 216 comprises a memory 218, such as a ROM, and a memory 220, such as a RAM. The address generator 216 is implemented using the same circuit as the address generator 208 and generates an address such that the $EX_{o2}$ data is read out of the memory 220 in sequential order, and not the interleaved order output by the decoder 204. The output of the reverse interleaver 214 is output as $EX_{i1}$ to the first SISO decoder 202. The interleaved data $EX_{o2}$ is stored interleaved in the memory 220 using the interleaved address generator, then it is read out sequentially, i.e., the address generator will generate the addresses such that $EX_{o2}$ is stored interleaved in the memory 220, then the data $EX_{i1}$ is read sequentially out of the memory 220. For example, the data of $EX_{o2}$ will be stored in an address location in memory 220 corresponding to the address from which it was read out of in memory 212. That is, the address generator provides a write address to write the data interleaved into memory 220 so that the data is read sequentially from memory 220. Accordingly, the extrinsic information from the second SISO decoder 204 is fed back to the first SISO decoder 202 when employing iterative decoding. The encoded data will be decoded repeatedly resulting in better extrinsic values. The number of iterations may be predetermined and is associated with the convergence of the extrinsic values to values corresponding to high confidence levels.

Figure 3:
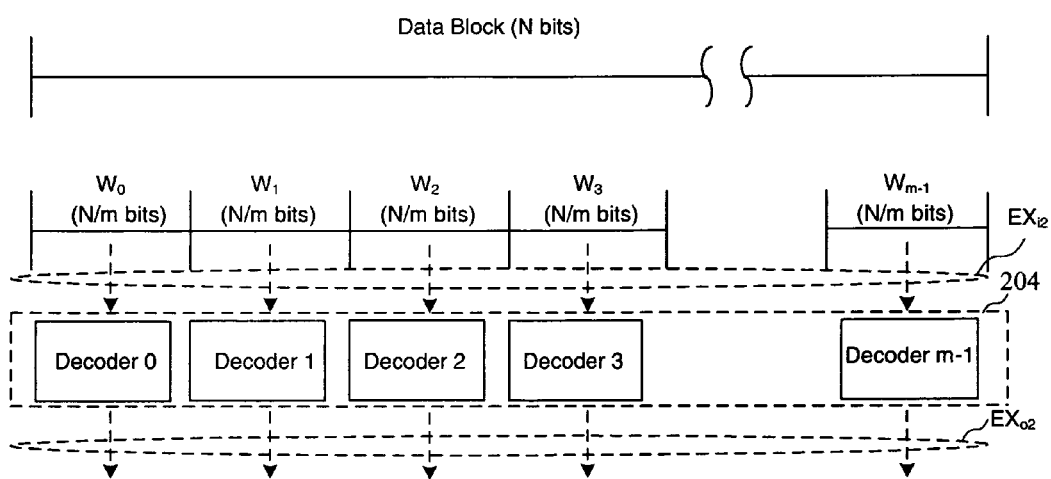
FIG. 3 is a diagram showing a data configuration for a parallel window processing approach according to an embodiment of the present invention.

Turning now to FIG. 3, a diagram shows a data configuration for a parallel window processing approach according to an embodiment of the present invention. In particular, FIG. 3 shows the parallel windowing approach where the data block is divided into m windows ($W_0$ through $W_{m-1}$) and each window is processed by a separate MAP decoder, such as one of decoders 0 through m−1. The plurality of SISO decoders may be operated in parallel to increase the throughput of the decoding process. The data in the windows coupled to the corresponding decoders are based upon interleaved addresses, and therefore generally correspond to data of a different window of the data block stored in the memory. Unlike conventional decoding circuits implementing a windowing approach where the number of windows m must be a power of two and the number of bits for each window (i.e., N/m) must also be a power of two, any value of m may be selected according to circuits and methods set forth below. Preferably, each window comprises an equal number of bits. Accordingly, m may be selected such that N/m comprises an integer. Alternatively, the number of bits N may be adjusted so that N/m comprises an integer for a desired value of m. That is, after selecting a value of m, it may be determined that N/m is not an integer. Therefore, N may adjusted so that N/m is an integer.

Figure 4:
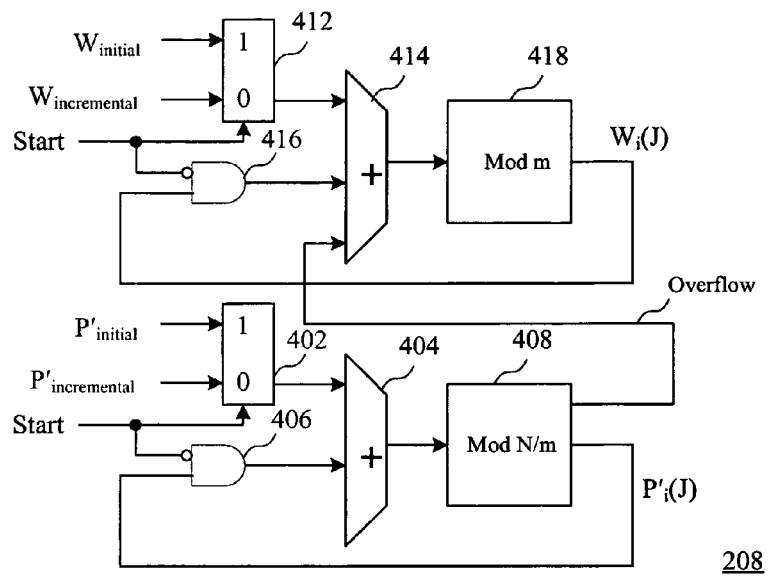
FIG. 4 is a block diagram of a circuit for generating an interleaver address according to an embodiment of the present invention.

Turning now to FIG. 4, a block diagram of the circuit for generating an interleaver address according to an embodiment of the present invention is shown. An initial address for a window $P'_{initial}$ and an incremental value $P'_{incremental}$ to be added to a previous interleaver address are coupled to a multiplexer 402 which receives a multiplexer select signal Start. The initial address $P'_{initial}$ and incremental address $P'_{incremental}$ may be stored in a memory associated with the address generator such as memory 210 of interleaver 206 of FIG. 2, for example. The Start signal is used to provide an initial address to a summing circuit 404 during a start-up phase during which an address is generated for each case of a plurality of cases, as will be described in more detail below. The Start signal is also coupled to an inverted input of an AND gate 406. The AND gate 406 is also coupled to receive a previous address. When the Start signal is high, selecting the initial address, the output of the AND gate is low, preventing the adding of the previous interleaver address output by a Mod N/m circuit 408. When the Start signal is low after the start-up phase, the $P'_{incremental}$ is added to the previous address, output by the Mod N/m circuit 408, by the summing circuit 404.

Similarly, an initial window select signal $W_{initial}$ for a window and an incremental value $W_{incremental}$ to be added to a window select signal are coupled to a multiplexer 412 which also receives the Start signal. The Start signal is also used to provide an initial window select value to a summing circuit 414 during a start-up phase during which a window select signal is generated for each case of the plurality of cases. The Start signal is also coupled to an inverted input of an AND gate 416. When Start signal is high, selecting the initial window select signal, the output of the AND gate is low, preventing adding the previous window select signal output by the Mod m generator 418. When the Start signal is low after the start-up phase, the $W_{incremental}$ is added to the previous window select signal by the summing circuit 414. As will be described in more detail below, an overflow signal from the Mod N/m circuit 408 is coupled to the summing circuit 414. The next interleaver address $P'_i(j)$ generated by the circuit of FIG. 4 will be the same for each window, while the window select value $W_i(j)$ will be the window select value for the first window $W_0$ coupled to decoder 0 and the window select value for the remaining windows will be calculated based upon the window number, as will be described in more detail below.

The modulo operation may be implemented using compare select circuitry. That is, if the address is greater than or equal to m (for mod m), then m is subtracted from the address. Otherwise, the address is passed as it is. $P'_i(j)$ and $W_i(j)$ are generated by the circuit of FIG. 4 where the interleaver address initial value ($P'_{initial}$) and incremental value ($P'_{incremental}$) are functions of predetermined parameters P0, P1, P2 and P3 and the new window length N/m. For example, the parameters P0, P1, P2, and P3 may be defined by a standard which implements Turbo Convolutional Coding, such as the IEEE 802.16e specification, available from the Institutute of Electrical and Electronics Engineers, Piscataway, N.J. The initial window value ($W_{initial}$) and incremental value ($W_{incremental}$) are also functions of the parameters P0, P1, P2 and P3 and the number of windows m. The modulo operation used in calculating the next interleaver address $P'_i(j)$ is modulo N/m, while the modulo operation used in calculating the window select signal $W_i(j)$ is modulo m. The overflow signal generated in the circuit that is used to calculate the new address $P'_i(j)$ is used in the circuit that is used to calculate the window select signal $W_i(j)$. In particular, an overflow generated when the address is greater than or equal to N/m is coupled to the portion of the circuit for generating a window select signal, and N/m is subtracted to obtain the address $P'_i(j)$. The overflow is preferably a single bit indicating if the address is greater than N/m.

According to one application of the circuit of FIG. 4, address values may be calculated according to different cases. For example, an initial address may be calculated for each of four cases where:

$$P_{initial} = (0*P0+1) \bmod N = 1 \quad \text{case 0}$$

$$P_{initial} = (1*P0+P1+1+N/2) \bmod N \quad \text{case 1}$$

$$P_{initial} = (2*P0+P2+1) \bmod N \quad \text{case 2}$$

$$P_{initial} = (3*P0+P3+1+N/2) \bmod N, \quad \text{case 3}$$

Similarly, an incremental address may be defined according to the equation:

$$P_{incremental} = (4*P0) \bmod N$$

The next address, $P'_i(j)$, is generated using mod N/m operation. That is, the counter is initialized to P'initial during the start-up phase, then incremented by P'incremental after the start-up phase. If the result of the summing of the previous address with incremental address is greater than or equal to N/m, then N/m is subtracted from the count. Therefore, $P'_{initial} = P_{initial} \bmod(N/m)$, and $P'_{incremental} = P_{incremental} \bmod(N/m)$.

It should be noted that $P'_i(j)$ is the same for all windows.

Similarly, $W_i(j)$ is generated by employing a counter initialized to $W_{initial}$, then incrementing by Wincremental, with an overflow signal coming from the circuit for generating $P'_i(j)$. If the result is greater or equal to m, then m is subtracted from the count. $W_{initial}$ and $W_{incremental}$ are defined as follows:

$W_{initial} = \mathrm{floor}(P_{initial}/(N/m))$, and $W_{incremental} = \mathrm{floor}(P_{incremental}/(N/m))$, where the floor function truncates the non-integral portion of the result. Similarly, $W_i(j)$ is generated as described above for the first window. That is, the counter is initialized to $W_{initial}$ during the start-up phase, then incremented by $W_{incremental}$ after the start-up phase. If the result of summing the previous window select value, the incremental value and the overflow is greater or equal to m, then m is subtracted from the count. However, for the remaining windows:

$W_i(j) = (W_i(j)$ for the first window $+ k_1 + k_2) \bmod m$ where $k_1 = 1, 2, 3, \ldots, m-1$ (i.e., the window number) and $k_2$ equals floor $(4*P0/(N/m))$. If the result of the calculation of $W_i(j)$ for the remaining windows is greater than m, then m is subtracted from the result.

Figure 5:
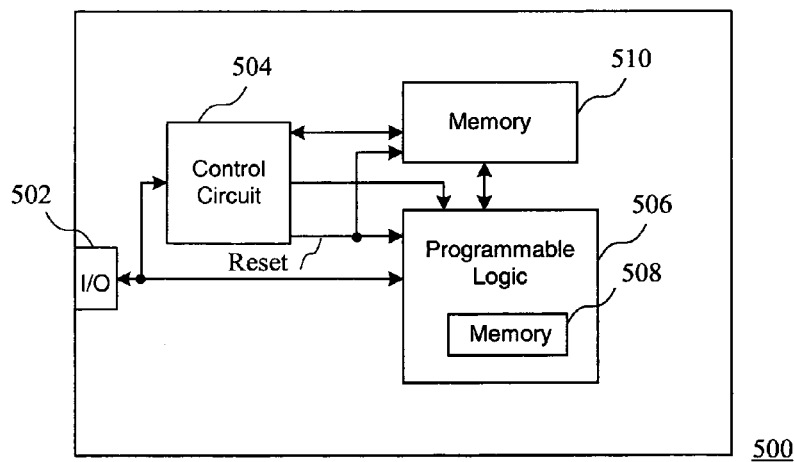
FIG. 5 is a block diagram of a programmable logic device according to an embodiment of the present invention.

Turning now to FIG. 5, a block diagram of a programmable logic device according to an embodiment of the present invention is shown. The circuit of FIG. 5 preferably comprises an integrated circuit 500 having an input/output port 502 coupled to a control circuit 504 a programmable logic circuit 506. The programmable logic circuit comprises gates which are configurable by a user of the circuit to implement a circuit design of the user. The circuits implemented in the programmable logic circuit are implemented according to configuration data downloaded to the integrated circuit 500. As will be described in more detail below, the programmable logic circuit comprises configuration memory 508. Generally, configuration memory 508 comprises memory cells for configuring the programmable logic based upon the configuration data. Although a single programmable logic circuit 506 is shown, it should be understood that the programmable logic circuit 506 may comprise a plurality of programmable logic circuits. Similarly, although a single configuration memory 508 is shown, a given programmable logic circuit may comprise a plurality of memory blocks having memory cells. Also, configuration memory 508 may be either volatile memory or non-volatile memory, or a programmable logic circuit may include both volatile and non-volatile memory. Finally, the circuit may comprise a memory 510, external to the programmable logic circuit, which may either be volatile or non-volatile memory. The circuit of FIG. 5 may be any device having programmable logic, such as a programmable logic device described above, or any integrated circuit having programmable logic, such as an application-specific integrated circuit (ASIC) having a portion of circuits which is programmable. According to one aspect of the embodiment of FIG. 5, the circuit of FIG. 4 may be implemented in programmable logic while data input to an interleaver may be stored in a memory of the circuit.

Figure 6:
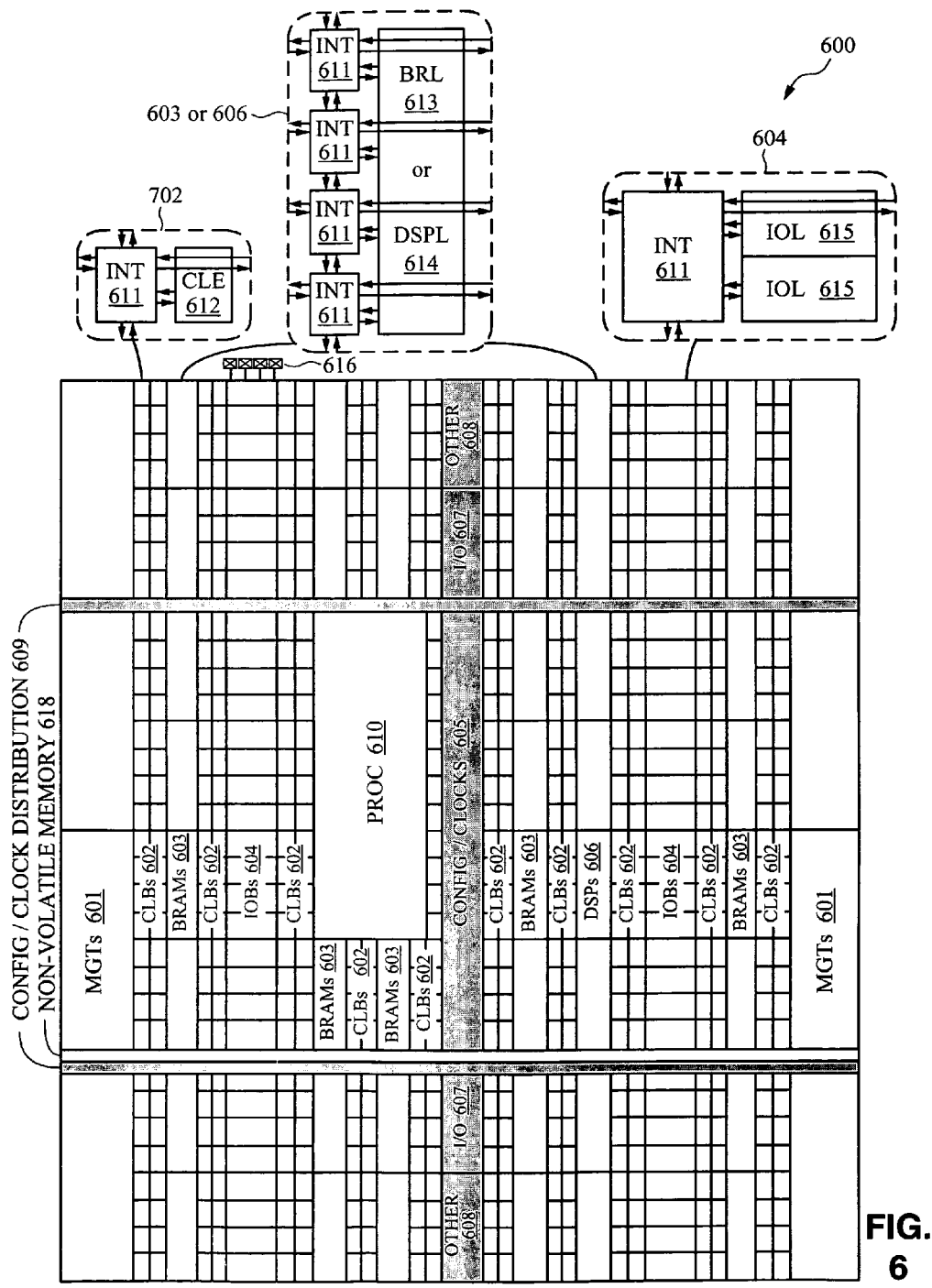
FIG. 6 is a block diagram of a field programmable gate array implementing a decoding circuit according to an embodiment of the present invention.

Turning now to FIG. 6, a block diagram of a field programmable gate array according to an embodiment of the present invention is shown. The circuit of FIGS. 1-4 may be implemented in the FPGA of FIG. 6. For example, the interleaver circuit may be implemented in a configurable logic block while the memory associated with storing the data to be interleaved may be a block of RAM, as will be described below. The FPGA architecture 600 of FIG. 6 includes a large number of different programmable tiles including multi-gigabit transceivers (MGTs 601), configurable logic blocks (CLBs 602), random access memory blocks (BRAMs 603), input/output blocks (IOBs 604), configuration and clocking logic (CONFIG/CLOCKS 605), digital signal processing blocks (DSPs 606), specialized input/output blocks (I/O 607) (e.g., configuration ports and clock ports), and other programmable logic 608 such as digital clock managers, analog-to-digital converters, system monitoring logic, and so forth. Some FPGAs also include one or more dedicated processor blocks (PROC 610).

In some FPGAs, each programmable tile includes a programmable interconnect element (INT 611) having standardized connections to and from a corresponding interconnect element in each adjacent tile. Therefore, the programmable interconnect elements taken together implement the programmable interconnect structure for the illustrated FPGA. The programmable interconnect element (INT 611) also includes the connections to and from the programmable logic element within the same tile, as shown by the examples included at the top of FIG. 6.

For example, a CLB 602 may include a configurable logic element (CLE 612) that may be programmed to implement user logic plus a single programmable interconnect element (INT 611). A BRAM 603 may include a BRAM logic element (BRL 613) in addition to one or more programmable interconnect elements. The BRAM comprises dedicated memory separate from the distributed RAM of a configuration logic block. The BRAM may store the input data which is stored sequentially, then read out using the interleaver address as described above. The data for the various windows of the data stream are then decoded for a new interleaver address generated according to the circuit of FIG. 4, for example. Typically, the number of interconnect elements included in a tile depends on the height of the tile. In the pictured embodiment, a BRAM tile has the same height as four CLBs, but other numbers (e.g., five) may also be used. A DSP tile 606 may include a DSP logic element (DSPL 614) in addition to an appropriate number of programmable interconnect elements. An IOB 604 may include, for example, two instances of an input/output logic element (IOL 615) in addition to one instance of the programmable interconnect element (INT 611). As will be clear to those of skill in the art, the actual I/O pads 616 connected, for example, to the I/O logic element 615 are manufactured using metal layered above the various illustrated logic blocks, and typically are not confined to the area of the input/output logic element 615.

In the pictured embodiment, a columnar area near the center of the die (shown shaded in FIG. 6) is used for configuration, clock, and other control logic. Horizontal areas 609 extending from this column are used to distribute the clocks and configuration signals across the breadth of the FPGA. Some FPGAs utilizing the architecture illustrated in FIG. 6 include additional logic blocks that disrupt the regular columnar structure making up a large part of the FPGA. The additional logic blocks may be programmable blocks and/or dedicated logic. For example, the processor block PROC 610 shown in FIG. 6 spans several columns of CLBs and BRAMs. Finally, a non-volatile memory 618 may be employed for on-chip storage of configuration data which is used to configure the configuration logic blocks or other programmable tiles as described above.

Note that FIG. 6 is intended to illustrate only an exemplary FPGA architecture. The numbers of logic blocks in a column, the relative widths of the columns, the number and order of columns, the types of logic blocks included in the columns, the relative sizes of the logic blocks, and the interconnect/logic implementations included at the top of FIG. 6 are purely exemplary. For example, in an actual FPGA more than one adjacent column of CLBs is typically included wherever the CLBs appear, to facilitate the efficient implementation of user logic. Similarly the circuits and methods of the present invention may be implemented in any device, including any type of programmable logic device, having configuration memory.

Figure 7:
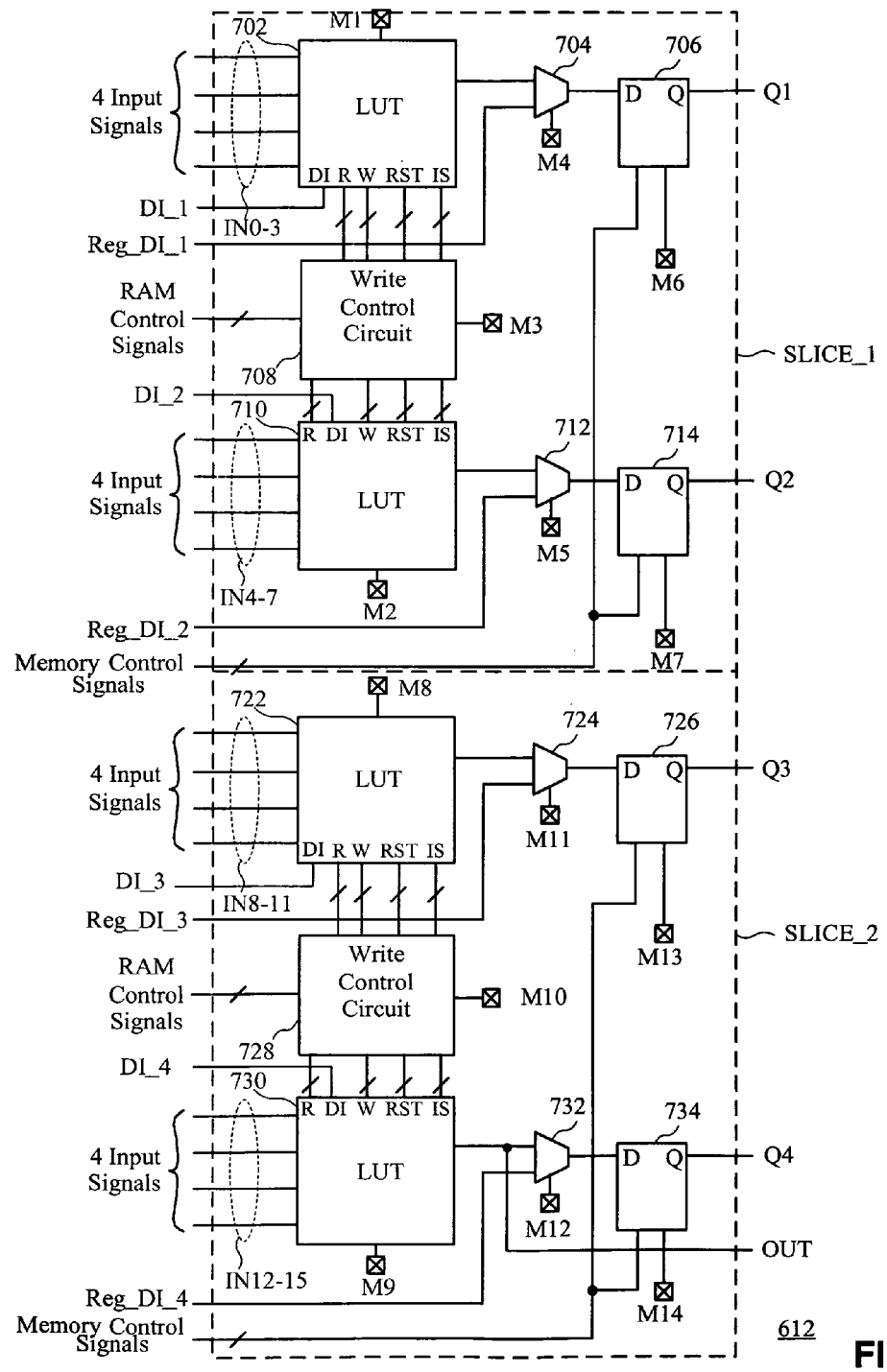
FIG. 7 is a block diagram of a configurable logic element of the field programmable gate array of FIG. 6.

Turning now to FIG. 7, a block diagram of a configurable logic element of the field programmable gate array of FIG. 6 is shown. In particular, FIG. 7 illustrates in simplified form a configurable logic element of a configuration logic block 202 of FIG. 6. The configurable logic element shown comprises two similar slices, where each slice comprises a pair of function generators. However, the configurable logic element may comprise more slices, such as four slices, for example. Each function generator may function in any of several modes depending upon the configuration data in the configuration memory elements M1-M14. As set forth above, the configuration memory elements M1-M14 may be changed during a partial (or complete) reconfiguration of an FPGA to change the mode of the function generator. When in RAM mode, input data is supplied by an input terminal RAM_DI_1, RAM_DI_2 to the data input (DI) terminal of the associated function generator. Each function generator provides an output signal to an associated multiplexer, which selects between the output signal function generator and an associated register direct input signal Reg_DI_1, Reg_DI_2 from the programmable interconnect element. Thus, each function generator may be optionally bypassed. When in look-up table mode, each function generator implemented as a look-up table has four data input signals IN0-IN3. Slice 1 comprises a function generator implemented as a LUT 702 coupled to a multiplexer 704. In particular, the LUT 702 receives 4 input signals which are decoded to generate an output associated with data stored in the LUT at the address designated by the input signals. The multiplexer 704 is adapted to receive the output of LUT 702 and a registered value of Reg_DI_1. The output of the multiplexer 704 is coupled to a register 706 which generates an output Q1.

A Write Control Circuit 708 is coupled to receive RAM control signals and generate signals to control the LUT 702. In addition to a data input (DI) coupled to receive RAM_DI_1 and conventional read and write control signals coupled to a read enable input (R) and a write enable input (W), the LUT 702 comprises a partial reset input (RST) for receiving a partial reset signal, and an initial state input (IS) for receiving an initial state signal. Such resetting of the memory elements enables resetting the LUT memory cells during a partial reconfiguration of a programmable logic device, including partial reconfiguration of a device during operation. Similarly, slice 1 comprises a function generator implemented as a LUT 510 coupled to a multiplexer 712. The LUT 710 is adapted to receive input signals IN4-IN7, while the multiplexer 712 is coupled to receive the output of the LUT 710 and a registered value of Reg_DI_2. The output of the multiplexer 712 is coupled to a register 714 which generates an output Q2. The write control circuit 708 also generates a partial reset signal and an initial state signal for selectively resetting or setting one or more of the bits of the LUT 710. One advantage of resetting LUT memory elements of a device during partial reconfiguration is that it is not necessary to cycle through the required clock cycles to set the correct data after the partial reconfiguration.

Similarly, slice 2 comprises a function generator implemented as a LUT 722 coupled to a multiplexer 724. The LUT 722 is adapted to receive input signals IN8-IN11, while the multiplexer 724 is coupled to receive the output of the LUT 722 and a registered value of Reg_DI_1. The output of the multiplexer 724 is coupled to a register 726 which generates an output Q3. A Write Control Circuit 728 is coupled to receive RAM control signals and generate signals to control the LUT 722. In particular, input signals IN8-IN11 are decoded to generate an output associated with data stored in the LUT at the address designated by the input signals. The LUT 722 comprises a partial reset input (RST) for receiving a partial reset signal, and an initial state input (IS) for receiving an initial state signal. Similarly, slice 2 comprises a function generator implemented as a LUT 730 coupled to a multiplexer 732. The LUT 730 is adapted to receive input signals IN12-1N15, while the multiplexer 732 is coupled to receive the output of the LUT 730 and a registered value of Reg_DI_2. The output of the multiplexer 732 is coupled to a register 734 which generates an output Q4. The write control circuit 728 also generates a partial reset signal and an initial state signal for selectively resetting or setting one or more of the bits of the LUT 730. The circuit of FIG. 4 may be implemented using one or more configurable logic elements according to FIG. 6.

Figure 8:
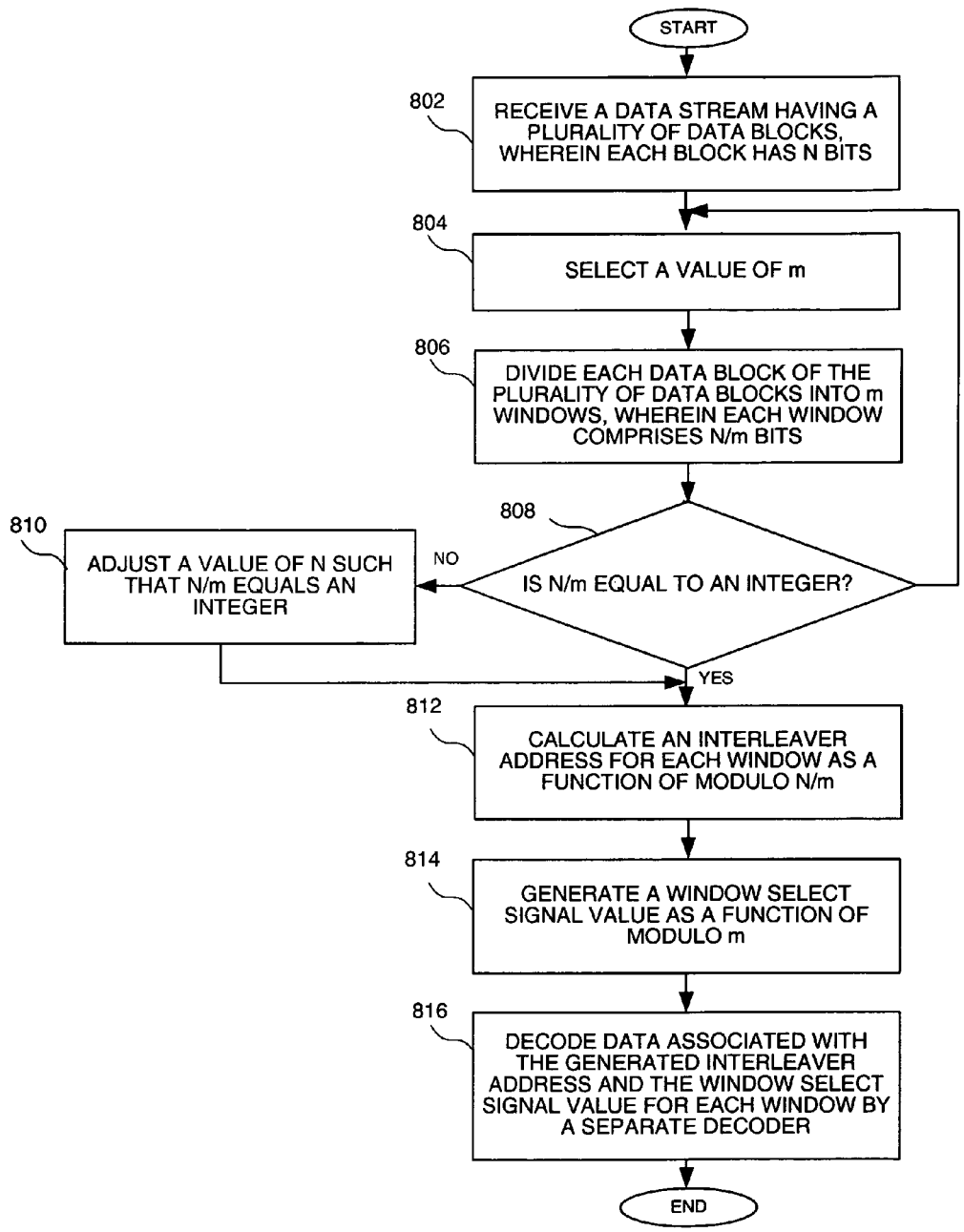
FIG. 8 is a flow chart showing a method of generating an interleaver address according to an embodiment of the present invention.

Turning now to FIG. 8, a flow chart shows a method of generating an interleaver address according to an embodiment of the present invention. The method of FIG. 8, as well as the method of FIG. 9 disclosed below, may be implemented according to the circuit described in reference to FIGS. 1-7, or other suitable circuits. A data stream having a plurality of data blocks, wherein each block has N bits, is received at a step 802. A value of m is selected at a step 804. Each data block of the plurality of data blocks is divided into m windows, wherein each window comprises N/m bits, at a step 806. It is then determined whether N/m is equal to an integer at a step 808. If not, a value of N is adjusted such that N/m is equal to an integer at a step 810. An interleaver address is calculated for each window as a function of modulo N/m at a step 812. A window select value is generated as a function of modulo m at a step 814. Data associated with the interleaver address and the window select value is decoded for each window by a separate decoder at a step 816.

Figure 9:
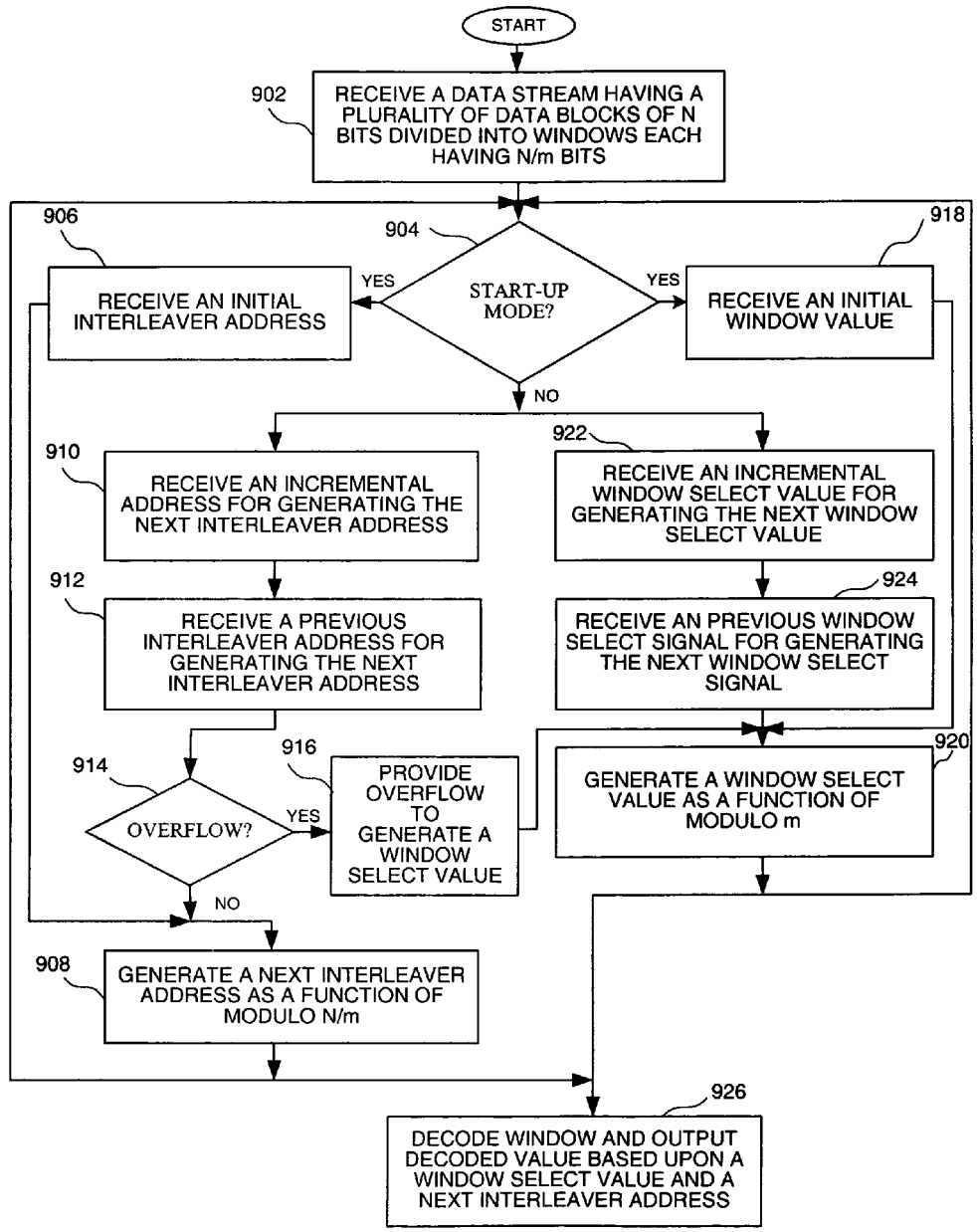
FIG. 9 is a flow chart showing a method of generating a window select signal according to an embodiment of the present invention.

Turning now to FIG. 9, a flow chart shows a method of generating an interleaver address according to an alternate embodiment of the present invention. A data stream having a plurality of data blocks of N bits is received at a step 902. Each of the N blocks is divided into m windows each having N/m bits. It is determined whether the circuit is in startup mode at a step 904. If the circuit is in start-up mode, an initial interleaver address is received at a step 906, and a next interleaver address is generated as a function of modulo N/m at a step 908. The initial interleaver address is used to generate a next interleaver address for each of a plurality of cases, as set forth above. If the device is not in start-up mode, an incremental address for generating the next interleaver address is received at a step 910. A previous interleaver address for generating the next interleaver address is also received at a step 912. It is then determined whether an overflow of the interleaver address portion of the circuit has occurred at a step 914. If so, the overflow is provided to generate the next window select value, as described in reference to FIG. 4. In either case, a next interleaver address is generated as a function of modulo N/m at the step 908. That is, the calculation of the next interleaver address and the window select value (set forth in steps 918-926) will be performed concurrently as described above in reference to the circuit of FIG. 4, for example.

If the device is in start-up mode, an initial window value is also received at a step 918, and the window select value is then generated as a function of modulo m at a step 920. If the device is not in start-up mode, an incremental window select value for generating the next window select value is also received at a step 922. A previous window select value for generating the next window select value is received at a step 924. A window select value is then generated as a function of modulo m at the step 920. Finally, a window is decoded based upon an interleaver address and a window select value at a step 926.

It can therefore be appreciated that the new and novel circuit for and method of generating an interleaver address has been described. While embodiments of the invention are generally presented in the context of turbo convolutional coding, the methods and systems described herein are equally applicable to other types of error correction coding implementations. It will be appreciated by those skilled in the art that numerous alternatives and equivalents will be seen to exist which incorporate the disclosed invention. As a result, the invention is not to be limited by the foregoing embodiments, but only by the following claims.

I claim:

1. A method of generating interleaver addresses in a circuit for decoding data, said method comprising the steps of:
    receiving a data stream having a plurality of data blocks, each data block having N bits;
    dividing each data block of said plurality of data blocks into m windows, each window comprising N/m bits;
    calculating an interleaver address for each window as a function of modulo N/m; and
    generating a window select value as a function of modulo m.

2. The method of claim 1 further comprising a step of selecting a value of m such that N/m comprises an integer.

3. The method of claim 1 further comprising a step of selecting a value of N such that N/m comprises an integer.

4. The method of claim 1 further comprising a step of selecting a value of m and adjusting a value of N such that N/m comprises an integer.

5. The method of claim 1 wherein said step of generating said window select value comprises a step of generating said window select value based upon an overflow from said step of calculating said interleaver address.

6. The method of claim 5 further comprising a step of decoding data associated with each window by a separate decoder.

7. A method of generating interleaver addresses in a circuit for decoding data, said method comprising the steps of:
    receiving a data stream having a plurality of data blocks, each data block having N bits;
    dividing each data block of said plurality of data blocks into m windows, each window comprising N/m bits;
    generating a next interleaver address as a function of modulo N/m;
    generating a window select value as a function of modulo m; and
    decoding a window of data based upon said window select value and said next interleaver address.

8. The method of claim 7 further comprising a step of receiving an incremental address and a previous interleaver address for generating said next interleaver address.

9. The method of claim 7 wherein said step of generating said window select value comprises a step of generating said window select value based upon an output of a circuit for generating said next interleaver address.

10. The method of claim 9 wherein said step of generating said window select value based upon said output of said circuit for generating said next interleaver address comprises a step of receiving an overflow from said circuit for generating said next interleaver address.

11. The method of claim 7 further comprising a step of receiving an incremental window select value for generating said window select value.

12. The method of claim 11 further comprising a step of receiving a previous window select value for generating said window select value.

13. A circuit for generating interleaver addresses, said circuit comprising:
    means for receiving a data stream having a plurality of blocks, each data block having N bits;
    means for partitioning each block of said plurality of blocks into m windows, each window comprising N/m bits; means for generating an interleaver address as a function of modulo N/m; and
    means for generating a window select value based upon a function of modulo m.

14. The circuit of claim 13 wherein said means for generating said window select value comprises means for receiving an overflow from said means for generating said interleaver address.

15. The circuit of claim 13 wherein said means for calculating said interleaver address comprises means for selecting a value of m.

16. The circuit of claim 13 further comprising means for decoding said data stream.

17. The circuit of claim 13 wherein said circuit is implemented in a programmable logic device.

* * * * *